United States Patent
Wang et al.

(10) Patent No.: US 10,504,938 B2
(45) Date of Patent: Dec. 10, 2019

(54) ARRAY SUBSTRATE AND METHOD OF MANUFACTURING THE SAME

(71) Applicants: BOE Technology Group Co., Ltd., Beijing (CN); Ordos Yuansheng Optoelectronics Co., Ltd., Inner Mongolia (CN)

(72) Inventors: Yuelin Wang, Beijing (CN); Yanyan Zhao, Beijing (CN); Jingyi Xu, Beijing (CN); Lei Li, Beijing (CN); Yezhou Fang, Beijing (CN); Tienan Liu, Beijing (CN); Yanwei Ren, Beijing (CN); Yishan Fu, Beijing (CN); Weida Qin, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 16/106,105

(22) Filed: Aug. 21, 2018

(65) Prior Publication Data
US 2019/0057985 A1  Feb. 21, 2019

(30) Foreign Application Priority Data
Aug. 21, 2017 (CN) .......................... 2017 1 0718137

(51) Int. Cl.
*H01L 27/12* (2006.01)
*G02F 1/1343* (2006.01)
(Continued)

(52) U.S. Cl.
CPC .... *H01L 27/1248* (2013.01); *G02F 1/134309* (2013.01); *G02F 1/136227* (2013.01);
(Continued)

(58) Field of Classification Search
CPC ........... H01L 27/1248; H01L 29/78672; H01L 27/1222; H01L 27/124; H01L 27/1288;
(Continued)

(56) References Cited

U.S. PATENT DOCUMENTS 10,133,409 B2 * 11/2018 Shi .......................... G06F 3/041
10,290,659 B2 *  5/2019 Xu ........................... H01L 27/12
(Continued)

FOREIGN PATENT DOCUMENTS

CN  101114668 A  1/2008
CN  102540539 A  7/2012
(Continued)

OTHER PUBLICATIONS

First Office Action dated Jun. 20, 2019 corresponding to Chinese application No. 201710718137.4.

*Primary Examiner* — John P. Dulka
(74) *Attorney, Agent, or Firm* — Nath, Goldberg & Meyer; Joshua B. Goldberg

(57) ABSTRACT

The present application provides an array substrate and a method of manufacturing the same. The array substrate includes a first substrate having a drain electrode protruding from a side of the first substrate; a planarization layer at the side of the first substrate where the drain electrode protrudes, the planarization layer being provided with a stepped hole on the drain electrode, and a diameter of the stepped hole decreasing along a direction from a side of the planarization layer facing away the first substrate towards a side of the planarization layer facing the first substrate; a pixel electrode at the stepped hole and connected with the drain electrode; a passivation layer covering the planarization layer and the pixel electrode; and a common electrode on the passivation layer.

20 Claims, 4 Drawing Sheets

(51) Int. Cl.
*G02F 1/1362* (2006.01)
*H01L 29/786* (2006.01)
*G02F 1/1333* (2006.01)

(52) U.S. Cl.
CPC ........ *H01L 27/124* (2013.01); *H01L 27/1222* (2013.01); *H01L 27/1262* (2013.01); *H01L 27/1288* (2013.01); *H01L 29/78672* (2013.01); *G02F 2001/133357* (2013.01); *G02F 2201/121* (2013.01); *G02F 2202/104* (2013.01)

(58) Field of Classification Search
CPC ........... H01L 27/1262; G02F 1/136227; G02F 1/134309
See application file for complete search history.

(56) References Cited

U.S. PATENT DOCUMENTS

| | | | | |
|---|---|---|---|---|
| 2005/0224984 | A1* | 10/2005 | Hortaleza | H01L 24/03 257/762 |
| 2013/0148319 | A1* | 6/2013 | Li | H05K 1/0215 361/759 |
| 2018/0061870 | A1* | 3/2018 | Yang | H01L 27/1225 |
| 2018/0146874 | A1* | 5/2018 | Walker | A61B 5/04012 |
| 2018/0190923 | A1* | 7/2018 | Heo | H01L 51/5262 |
| 2018/0275469 | A1* | 9/2018 | Huo | G02F 1/133514 |
| 2018/0323224 | A1* | 11/2018 | Hung | H01L 27/1288 |

FOREIGN PATENT DOCUMENTS

| | | |
|---|---|---|
| CN | 102929022 A | 2/2013 |
| CN | 104183648 A | 12/2014 |

* cited by examiner

ARRAY SUBSTRATE AND METHOD OF MANUFACTURING THE SAME

CROSS-REFERENCE TO RELATED APPLICATION

This application claims priority to Chinese Patent Application No. 201710718137.4, filed on Aug. 21, 2017, the entire contents of which are hereby incorporated by reference.

TECHNICAL FIELD

The present disclosure relates to the field of display technology, and particularly to an array substrate and a method of manufacturing the same.

BACKGROUND

In a conventional array substrate, a pixel electrode, a planarization layer, a passivation layer and the like are formed on a base substrate (for example, a glass substrate), in which the pixel electrode is formed on a side of the planarization layer facing away the base substrate and partially covers the planarization layer (i.e., the pixel electrode protrudes from the planarization layer), and the passivation layer is formed on a side of the pixel electrode and the planarization layer facing away the base substrate and covers the pixel electrode and the planarization layer. For this reason, there is a difference in thickness between a portion of the passivation layer that is in contact with the pixel electrode and a portion of the passivation layer that is in contact with the planarization layer, thereby forming a segment difference substantially equal to a thickness of the pixel electrode.

SUMMARY

In an aspect, the present disclosure provides an array substrate, which includes: a first substrate having a drain electrode protruding from a side of the first substrate; a planarization layer at the side of the first substrate where the drain electrode protrudes, the planarization layer being provided with a stepped hole on the drain electrode, and a diameter of the stepped hole decreasing along a direction from a side of the planarization layer facing away the first substrate towards a side of the planarization layer facing the first substrate; a pixel electrode at the stepped hole and connected with the drain electrode; a passivation layer covering the planarization layer and the pixel electrode; and a common electrode on the passivation layer.

In some embodiments, an absolute value of a difference in height between an upper surface of the planarization layer and an upper surface of the pixel electrode is smaller than a thickness of the pixel electrode. The upper surface of the planarization layer is a surface of a portion of the planarization layer at the side of the planarization layer facing away the first substrate, the portion of the planarization layer being a portion other than the stepped hole, and the upper surface of the pixel electrode is a surface of a portion of the pixel electrode at a side of the pixel electrode facing away the first substrate, the portion of the pixel electrode being on a step of the stepped hole farthest away from the first substrate.

In some embodiments, the upper surface of the pixel electrode is flush with the upper surface of the planarization layer.

In some embodiments, the upper surface of the pixel electrode protrudes out of the upper surface of the planarization layer by a height smaller than the thickness of the pixel electrode.

In some embodiments, the upper surface of the pixel electrode recesses into the upper surface of the planarization layer by a depth smaller than the thickness of the pixel electrode.

In some embodiments, a hole of the stepped hole farthest away from the first substrate has a shape and size that is in consistent with a shape and size of the pixel electrode of the array substrate.

In some embodiments, the array substrate is a bottom-gate type array substrate or a top-gate type array substrate.

In some embodiments, the stepped hole includes a first portion and a second portion, the first portion being at a side of the second portion facing the first substrate. The first portion has a diameter decreasing along the direction from the side of the planarization layer facing away the first substrate towards the side of the planarization layer facing the first substrate. The second portion has a constant diameter along the direction from the side of the planarization layer facing away the first substrate towards the side of the planarization layer facing the first substrate.

In some embodiments, an orthographic projection of the pixel electrode on the first substrate substantially completely overlaps with an orthographic projection of the stepped hole on the first substrate.

In another aspect, the present disclosure further provides a method of manufacturing an array substrate including steps of: forming a first substrate having a drain electrode protruding from a side of the first substrate; forming a planarization layer covering the side of the first substrate where the drain electrode protrudes; providing a stepped hole at a portion of the planarization layer on the drain electrode, a diameter of the stepped hole decreasing along a direction from a side of the planarization layer facing away the first substrate towards a side of the planarization layer facing the first substrate; forming a pixel electrode, the pixel electrode being formed at the stepped hole and connected with the drain electrode; forming a passivation layer covering the planarization layer and the pixel electrode; and forming a common electrode on the passivation layer.

In some embodiments, the step of providing the stepped hole at the portion of the planarization layer on the drain electrode includes a step of providing the stepped hole at the portion of the planarization layer on the drain electrode by exposure and etching with a mask. The mask includes a fully transparent region and a partially transparent region surrounding and directly connected with the fully transparent region. The fully transparent region is configured to form a hole of the stepped hole closest to the first substrate, and the partially transparent region is configured to form a hole of the stepped hole other than the hole closest to the first substrate.

In some embodiments, an absolute value of a difference between a depth of a hole of the stepped hole farthest away from the first substrate, which is formed through the partially transparent region, and a thickness of the pixel electrode of the array substrate is smaller than the thickness of the pixel electrode.

In some embodiments, the depth of the hole of the stepped hole farthest away from the first substrate, which is formed through the partially transparent region, is equal to the thickness of the pixel electrode of the array substrate.

In some embodiments, the depth of the hole of the stepped hole farthest away from the first substrate, which is formed through the partially transparent region, is smaller than the thickness of the pixel electrode of the array substrate.

In some embodiments, the depth of the hole of the stepped hole farthest away from the first substrate, which is formed through the partially transparent region, is larger than the thickness of the pixel electrode of the array substrate but smaller than approximately twice of the thickness of the pixel electrode.

In some embodiments, the partially transparent region and the fully transparent region as an entirety have a shape and size matching with a shape and size of the pixel electrode of the array substrate, such that a hole of the stepped hole farthest away from the first substrate has a shape and size that is in consistent with the shape and size of the pixel electrode of the array substrate.

In some embodiments, the stepped hole is formed to include a first portion and a second portion, the first portion is at a side of the second portion facing the first substrate. The first portion is formed to have a diameter decreasing along the direction from the side of the planarization layer facing away the first substrate towards the side of the planarization layer facing the first substrate. The second portion is formed to have a constant diameter along the direction from the side of the planarization layer facing away the first substrate towards the side of the planarization layer facing the first substrate.

In some embodiments, the pixel electrode and the stepped hole are formed such that an orthographic projection of the pixel electrode on the first substrate substantially completely overlaps with an orthographic projection of the stepped hole on the first substrate.

DETAILED DESCRIPTION

A clear and complete description of technical solutions of embodiments of the present disclosure will be given below in combination with the accompanying drawings. Apparently, the embodiments described below are merely a part, but not all, of the embodiments of the present disclosure. All of other embodiments, obtained by a person skilled in the art based on the embodiments of the present disclosure without any inventive efforts, fall into the protection scope of the present disclosure.

In a conventional array substrate, a pixel electrode, a planarization layer, a passivation layer and the like are formed on a base substrate (for example, a glass substrate), in which the pixel electrode is formed on a side of the planarization layer facing away the base substrate and partially covers the planarization layer (i.e., the pixel electrode protrudes from the planarization layer), and the passivation layer is formed on a side of the pixel electrode and the planarization layer facing away the base substrate and covers the pixel electrode and the planarization layer. For this reason, there is a difference in thickness between a portion of the passivation layer that is in contact with the pixel electrode and a portion of the passivation layer that is in contact with the planarization layer, thereby forming a segment difference substantially equal to a thickness of the pixel electrode.

Figure 1:
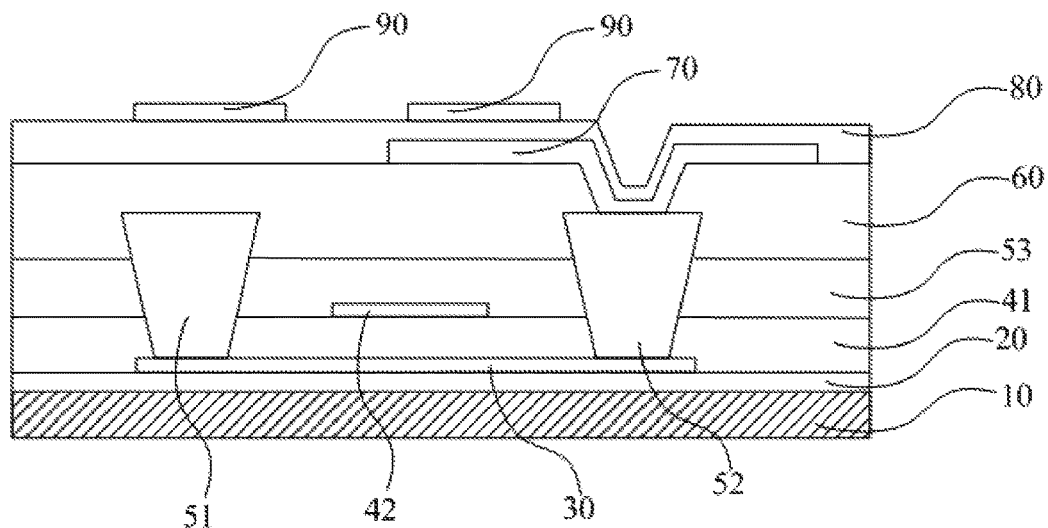
FIG. 1 is a schematic diagram of an existing array substrate.

FIG. 1 is a schematic diagram of an existing array substrate. As illustrated in FIG. 1, the array substrate includes a glass substrate 10, a buffer layer 20, an active layer 30, a gate insulating layer 41, a gate electrode 42, a source electrode 51, a drain electrode 52, an inter-layer insulating layer 53, a planarization layer 60, a pixel electrode 70, a passivation layer 80 and a common electrode 90. The planarization layer 60 is provided with a via on the drain electrode 52, and the pixel electrode 70 covers the via and is connected with the drain electrode 52. The passivation layer 80 covers the planarization layer 60 and the pixel electrode 70, and the common electrode 90 is formed on the passivation layer 80. In the array substrate as illustrated in FIG. 1, an electric field formed by two electrode layers of the pixel electrode 70 and the common electrode 90 is relatively uniformly distributed with fewer dead angles of the electric field, such that a display panel having the array substrate has a relatively high transmittance. However, the pixel electrode 70 is formed on a surface of the planarization layer 60, resulting in that the pixel electrode 70 protrudes from the planarization layer 60 by a height equal to a thickness of the pixel electrode 70, i.e., the pixel electrode protrudes from the planarization layer by the thickness of a pixel electrode. For this reason, the passivation layer has a segment difference equal to the thickness of the pixel electrode at an edge position of the pixel electrode (more specifically, at a position where the pixel electrode, the passivation layer and the planarization layer are in contact with each other), and the segment difference is directly decided by the pixel electrode. Since the passivation layer has the segment difference equal to the thickness of the pixel electrode at the edge position of the pixel electrode, the passivation layer is likely to curl up and fall off near the edge position of the pixel electrode, which in turn results in a high defect rate of the array substrate, and a liquid crystal panel having the array substrate may have a dark spot defect.

Accordingly, the present disclosure provides, inter alia, an array substrate and a method of manufacturing an array substrate that substantially obviate one or more of the problems due to limitations and disadvantages of the related art. In an aspect, the present disclosure provides an array substrate. In some embodiments, the array substrate includes a first substrate having a drain electrode protruding from a side of the first substrate; a planarization layer at the side of the first substrate where the drain electrode protrudes, the planarization layer being provided with a stepped hole on the drain electrode, and a diameter of the stepped hole decreasing along a direction from a side of the planarization layer facing away the first substrate towards a side of the planarization layer facing the first substrate; a pixel electrode at the stepped hole and connected with the drain electrode; a passivation layer covering the planarization layer and the pixel electrode; and a common electrode on the passivation layer.

Figure 2:
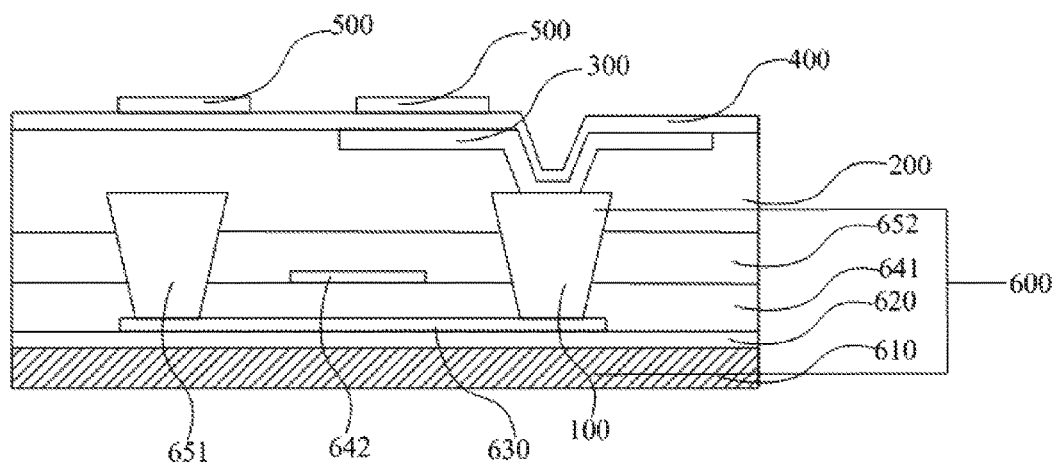
FIG. 2 is a schematic diagram illustrating an array substrate according to some embodiments of the present disclosure.
Figure 3:
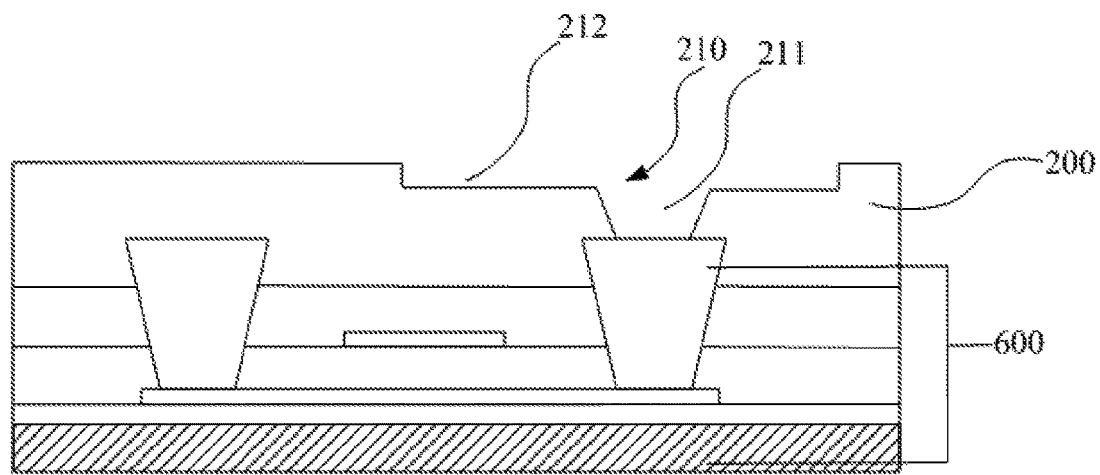
FIG. 3 is a schematic diagram illustrating a stepped hole in a planarization layer of the array substrate in FIG. 2.

FIG. 2 is a schematic diagram illustrating an array substrate according to some embodiments of the present disclosure. FIG. 3 is a schematic diagram illustrating a stepped hole in a planarization layer of the array substrate in FIG. 2. Referring to FIGS. 2 and 3, in some embodiments of the present disclosure, the array substrate includes a first substrate 600 having a drain electrode 100 protruding from a side of the first substrate 600; a planarization layer 200 at the side of the first substrate 600 where the drain electrode 100 protrudes, the planarization layer 200 being provided with a stepped hole 210 on (e.g., directly above) the drain electrode 100, and a diameter of the stepped hole 210 decreasing along a direction from a side of the planarization layer 200 facing away the first substrate 600 towards a side of the planarization layer 200 facing the first substrate 600. As illustrated in FIG. 3, for convenience of description, the stepped hole 210 can be regarded to include two portions, a first portion 211 (i.e., a hole of the stepped hole closest to the first substrate) and a second portion 212 (i.e., a hole of the stepped hole farthest away from the first substrate). A portion of the stepped hole 210 close to the first substrate 600 is the first portion 211, and a portion of the stepped hole away from the first substrate 600 is the second portion 212. In some embodiments, the first portion has a diameter smaller than that of the second portion. In some embodiments, the first portion is at a side of the second portion facing the first substrate, the first portion has a diameter gradually decreasing along the direction from the side of the planarization layer facing away the first substrate towards the side of the planarization layer facing the first substrate, and the second portion has a constant diameter along the direction from the side of the planarization layer facing away the first substrate towards the side of the planarization layer facing the first substrate. In some embodiments, the second portion has a constant dimension (e.g., width and/or length in a plan view of the array substrate) along the direction from the side of the planarization layer facing away the first substrate towards the side of the planarization layer facing the first substrate.

As illustrated in FIG. 2, the array substrate further includes a pixel electrode 300 at the stepped hole 210 and connected with the drain electrode 100; a passivation layer 400 covering the planarization layer 200 and the pixel electrode 300; and a common electrode 500 on the passivation layer 400.

In some embodiments, an orthographic projection of the pixel electrode on the first substrate substantially overlaps (e.g., completely overlaps) with an orthographic projection of the stepped hole on the first substrate. Referring to FIGS. 2 and 3, an orthographic projection of the pixel electrode 300 on the first substrate 600 substantially completely overlaps with an orthographic projection of the stepped hole 210 on the first substrate 600. For example, these two projections have a substantially same area and shape.

The array substrate according to the embodiments of the present disclosure includes a first substrate, a planarization layer, a pixel electrode, a passivation layer and a common electrode. In some embodiments, the first substrate has a drain electrode protruding from a side of the first substrate, the planarization layer is at a side of the first substrate where the drain electrode protrudes, the planarization layer being provided with a stepped hole on the drain electrode, and a diameter of the stepped hole decreasing along a direction from a side of the planarization layer facing away the first substrate towards a side of the planarization layer facing the first substrate; the pixel electrode is at the stepped hole and connected with the drain electrode; the passivation layer covers the planarization layer and the pixel electrode; and the common electrode is on the passivation layer. In this manner, the planarization layer is provided with the stepped hole on the drain electrode, a diameter of the stepped hole decreasing in the direction from the side of the planarization layer facing away the first substrate towards the side of the planarization layer facing the first substrate, and the pixel electrode is formed at the stepped hole, i.e., the pixel electrode is formed at the stepped hole recessing in a direction towards the first substrate. As such, relative to a surface of a portion of the planarization layer other than the stepped hole at a side of the planarization layer facing away the first substrate, the pixel electrode protrudes by a height smaller than a thickness of the pixel electrode, or the pixel electrode may be lower than the surface of the portion of the planarization layer other than the stepped hole at the side of the planarization layer facing away the first substrate. Therefore, in a case where the thickness of the pixel electrode is a fixed value, a segment difference between the pixel electrode and the surface of the portion of the planarization layer other than the stepped hole at the side of the planarization layer facing away the first substrate can be controlled by controlling a height of a second portion (e.g., the second portion 212 in FIG. 3) of the stepped hole, such that the segment difference of the passivation layer at the edge position of the pixel electrode (e.g., at the position where the pixel electrode, the passivation layer and the planarization layer are in contact with each other) is controllable. By controlling the segment difference of the passivation layer at the edge position of the pixel electrode to be smaller than the thickness of the pixel electrode, it can reduce the possibility of the curling up and falling off of the passivation layer near the edge position of the pixel electrode, which in turn improves the yield of the array substrate and also reduces possibility of the dark spot defect occurring in the liquid crystal panel having the array substrate.

The segment difference of the passivation layer at the edge position of the pixel electrode is controllable, and in some embodiments, an absolute value of a difference in height between an upper surface of the planarization layer and an upper surface of the pixel electrode is smaller than a thickness of the pixel electrode.

Here, the upper surface of the planarization layer is a surface of a portion of the planarization layer at a side of the planarization layer facing away the first substrate, the portion of the planarization layer being a portion other than the stepped hole, and the upper surface of the pixel electrode is a surface of a portion of the pixel electrode at a side of the pixel electrode facing away the first substrate, the portion of the pixel electrode being on a step of the stepped hole farthest away from the first substrate. For example, the portion of the pixel electrode is the pixel electrode in the second portion 212 of FIG. 2, i.e., the pixel electrode in the first portion 211 is not included in the portion.

As such, the segment difference of the passivation layer at the edge position of the pixel electrode is smaller than the thickness of the pixel electrode, so it can reduce the possibility of the curling up and falling off of the passivation layer near the edge position of the pixel electrode, which in turn improves the yield of the array substrate and also reduces possibility of the dark spot defect occurring in the liquid crystal panel having the array substrate.

In some embodiments, an absolute value of a difference in height between an upper surface of the planarization layer and an upper surface of the pixel electrode is smaller than a thickness of the pixel electrode.

In some embodiments, as illustrated in FIG. 2, the upper surface of the planarization layer 200 is flush with the upper surface of the pixel electrode 300. That is, there is no segment difference of the passivation layer at the edge position of the pixel electrode. Since there is no segment difference of the passivation layer at the edge position of the pixel electrode, and the passivation layer at the edge position of the pixel electrode forms a flat plane, the possibility of the curling up and falling off of the passivation layer near the edge position of the pixel electrode can be reduced to the largest extent, which in turn improves the yield of the array substrate.

In some embodiments, a second portion (e.g., the second portion 212 in FIG. 3) of the stepped hole has a depth smaller than a thickness of the pixel electrode, i.e., the upper surface of the pixel electrode protrudes out of the upper surface of the passivation layer by a height smaller than the thickness of the pixel electrode.

In some embodiments, a second portion of the stepped hole has a depth larger than a thickness of the pixel electrode but smaller than twice of the thickness of the pixel electrode, i.e., the upper surface of the pixel electrode recesses into the upper surface of the passivation layer by a depth smaller than the thickness of the pixel electrode.

According to the embodiments of the present disclosure, the possibility of the curling up and falling off of the passivation layer near the edge position of the pixel electrode can be reduced, which in turn improves the yield of the array substrate and also reduces possibility of the dark spot defect occurring in the liquid crystal panel having the array substrate.

The shape and size of the pixel electrode are related to an array substrate and a color filter substrate used together with the array substrate. Thus, the shape and size of the pixel electrode depend on the array substrate and the color filter substrate used together with the array substrate, and the shape and size of the second portion 212 of the stepped hole are required to be in consistent with the shape and size of the pixel electrode of the array substrate.

As such, the shape and size of the second portion 212 of the stepped hole are in consistent with the shape and size of the pixel electrode of the array substrate, such that the stepped hole can be fitted in other structures of the array substrate, thereby reducing changes on the structure of the array substrate.

The array substrate according to the embodiments of the present disclosure is not limited to the above structures, and the improvement on the position of the pixel electrode according the present disclosure can be applied to any array substrate as long as the array substrate has a pixel electrode and a common electrode provided thereon and electrically insulated from each other, the pixel electrode is at a relatively lower side close to the first substrate, and the common electrode is at a relatively upper side away from the first substrate. The array substrate according to the present disclosure may be a bottom-gate type array substrate or a top-gate type array substrate. Similarly, the array substrate according to the present disclosure may be a polysilicon array substrate, an amorphous silicon array substrate, or the like.

The first substrate in the array substrate according to the present disclosure may have various structures depending on the type of the array substrate. For the array substrate as illustrated in FIGS. 2 and 3, the first substrate 600 includes a glass substrate 610, a buffer layer 620, an active layer 630, a gate insulating layer 641, a gate electrode 642, a source electrode 651, an inter-layer insulating layer 652 and the like. The inter-layer insulating layer 652 is configured to electrically insulate the source electrode from the drain electrode. In a case where the array substrate is a polysilicon array substrate, the active layer is made of a polysilicon material, and a shielding layer (not illustrated in the drawings) is formed between the glass substrate and the buffer layer to shield the active layer made of polysilicon.

Figure 4:
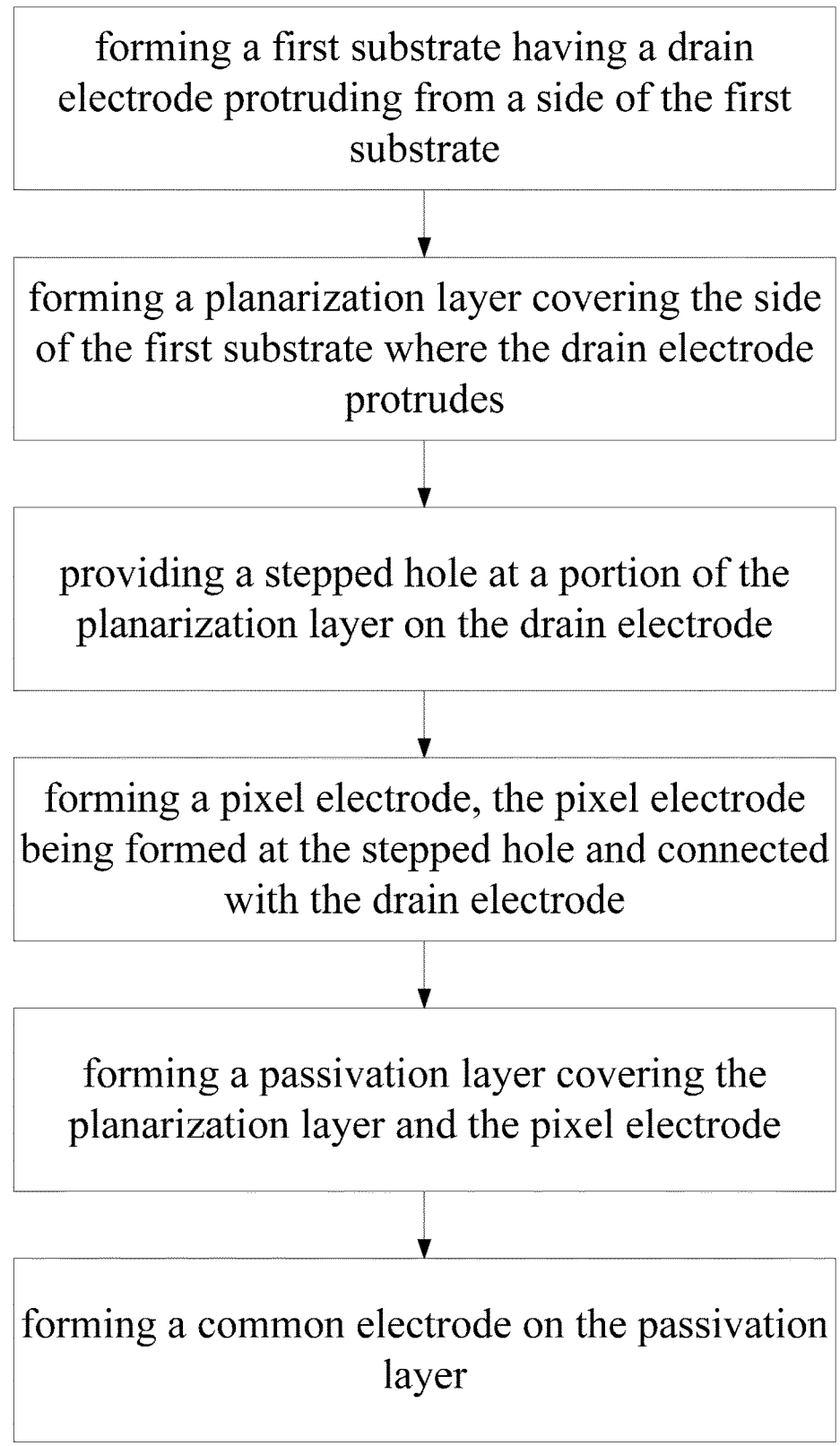
FIG. 4 is a flowchart illustrating a method of manufacturing an array substrate according to some embodiments of the present disclosure.

In another aspect, the present disclosure further provides a method of manufacturing an array substrate. FIG. 4 is a flowchart illustrating a method of manufacturing an array substrate according to some embodiments of the present disclosure. As illustrated in FIG. 4, the method in some embodiments includes steps of: forming a first substrate having a drain electrode protruding from a side of the first substrate; forming a planarization layer covering the side of the first substrate where the drain electrode protrudes; providing a stepped hole at a portion of the planarization layer on the drain electrode, a diameter of the stepped hole decreasing along a direction from a side of the planarization layer facing away the first substrate towards a side of the planarization layer facing the first substrate; forming a pixel electrode, the pixel electrode being formed at the stepped hole and connected with the drain electrode; forming a passivation layer covering the planarization layer and the pixel electrode; and forming a common electrode on the passivation layer.

In the related art, methods of manufacturing conventional array substrates include a step of providing a via at a portion of a passivation layer on the drain electrode. The method of manufacturing an array substrate according to embodiments of the present disclosure does not have any additional manufacturing step, but replace the step of providing the via at the portion of the passivation layer on the drain electrode in the related art with the step of providing the stepped hole at the portion of the passivation layer on the drain electrode, the diameter of the stepped hole decreasing along a direction from a side of the planarization layer facing away the first substrate towards a side of the planarization layer facing the first substrate. According to the method of the present disclosure, a thus manufactured array substrate has a passivation layer with a controllable segment difference at the edge position of the pixel electrode, so it can reduce the possibility of the curling up and falling off of the passivation layer near the edge position of the pixel electrode, which in turn improves the yield of the array substrate and also reduces possibility of the dark spot defect occurring in the liquid crystal panel having the array substrate.

In some embodiments, the step of providing the stepped hole at the portion of the passivation layer on the drain electrode includes a step of providing the stepped hole at the portion of the planarization layer on the drain electrode by exposure and etching with a mask.

Figure 5:
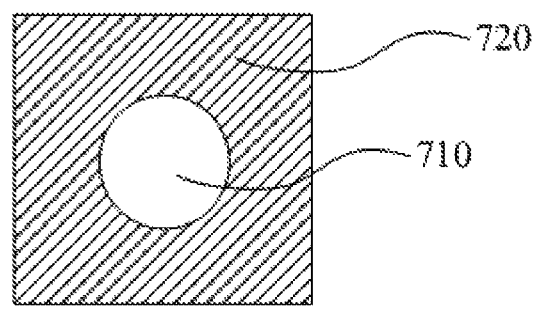
FIG. 5 is a partial schematic diagram illustrating a mask used for providing a stepped hole in a planarization layer in the method of manufacturing an array substrate of FIG. 4.

FIG. 5 is a partial schematic diagram illustrating a mask used for providing a stepped hole in a planarization layer in the method of manufacturing an array substrate of FIG. 4. As illustrated in FIG. 5, in some embodiments, the mask includes a fully transparent region (e.g., a via) 710 and a partially transparent region 720 surrounding and directly connected with the fully transparent region.

Here, the fully transparent region 710 is configured to form a first portion (e.g., the first portion 211 in FIG. 3) of the stepped hole, and the partially transparent region 720 is configured to form a second portion (e.g., the second portion 212 in FIG. 3) of the stepped hole. The second portion has a diameter greater than that of the first portion.

As such, the above-mentioned stepped hole can be formed through a single process of exposure and etching using only one mask having the fully transparent region and the partially transparent region.

A depth of the second portion (e.g., the second portion 212 in FIG. 3) of the stepped hole formed by the partially transparent region of the mask is related to the transmittance of the partially transparent region of the mask. The transmittance of the partially transparent region of the mask can be controlled such that an absolute value of the difference between the depth of the second portion of the stepped hole formed by the partially transparent region of the mask and the thickness of the pixel electrode of the array substrate is smaller than the thickness of the pixel electrode.

In some embodiments, an absolute value of the difference between the depth of the second portion of the stepped hole formed by the partially transparent region and the thickness of the pixel electrode of the array substrate is smaller than the thickness of the pixel electrode.

In some embodiments, the depth of the second portion of the stepped hole formed by the partially transparent region is equal to the thickness of the pixel electrode of the array substrate.

In some embodiments, the depth of the second portion of the stepped hole formed by the partially transparent region is smaller than the thickness of the pixel electrode of the array substrate.

In some embodiments, the depth of the second portion of the stepped hole formed by the partially transparent region is larger than the thickness of the pixel electrode of the array substrate but smaller than approximately twice of the thickness of the pixel electrode.

In some embodiments, the stepped hole is formed to include a first portion and a second portion, and the first portion is at a side of the second portion facing the first substrate. The first portion may be formed by the fully transparent region. The first portion is formed to have a diameter decreasing along the direction from the side of the planarization layer facing away the first substrate towards the side of the planarization layer facing the first substrate. The second portion may be formed by the partially transparent region. The second portion is formed to have a constant diameter along the direction from the side of the planarization layer facing away the first substrate towards the side of the planarization layer facing the first substrate.

According to the embodiments of the present disclosure, the possibility of the curling up and falling off of the passivation layer near the edge position of the pixel electrode can be reduced, which in turn improves the yield of the array substrate and also reduces possibility of the dark spot defect occurring in the liquid crystal panel having the array substrate.

The shape and size of the pixel electrode are related to an array substrate and a color filter substrate used together with the array substrate. Thus, the shape and size of the pixel electrode depend on the array substrate and the color filter substrate used together with the array substrate, and the shape and size of the second portion (e.g., the second portion 212 in FIG. 3) of the stepped hole are required to be in consistent with the shape and size of the pixel electrode of the array substrate. To achieve this effect, in the method of manufacturing the array substrate, the shape and size of the partially transparent region and the fully transparent region as an entirety are required to match with the shape and size of the pixel electrode of the array substrate, such that the second portion of the stepped hole has a shape and size in consistent with the shape and size of the pixel electrode of the array substrate.

In some embodiments, the pixel electrode and the stepped hole are formed such that an orthographic projection of the pixel electrode on the first substrate substantially completely overlaps with an orthographic projection of the stepped hole on the first substrate. Referring to FIGS. 2 and 3, the orthographic projection of the pixel electrode 300 on the first substrate 600 substantially completely overlaps with the orthographic projection of the stepped hole 210 on the first substrate 600. For example, these two projections have a substantially same area and shape.

The manufacturing methods for different types of array substrates are different, and other necessary steps for manufacturing the array substrate adopt corresponding steps.

Obviously, those skilled in the art can make various changes and variations of the embodiments of the present disclosure without departing from the spirit and scope of the present disclosure. Accordingly, the present disclosure intends to encompass these changes and variations in the case that these changes and variations of the present disclosure fall into the scope of the claims of the present disclosure and their equivalent technologies.

What is claimed is:

1. An array substrate, comprising:
a first substrate having a drain electrode protruding from a side of the first substrate;
a planarization layer at the side of the first substrate where the drain electrode protrudes, the planarization layer being provided with a stepped hole on the drain electrode, and a diameter of the stepped hole decreasing along a direction from a side of the planarization layer facing away the first substrate towards a side of the planarization layer facing the first substrate;
a pixel electrode at the stepped hole and connected with the drain electrode;
a passivation layer covering the planarization layer and the pixel electrode; and
a common electrode on the passivation layer,
wherein an orthographic projection of the pixel electrode on the first substrate substantially completely overlaps with an orthographic projection of the stepped hole on the first substrate.

2. The array substrate of claim 1, wherein an absolute value of a difference in height between an upper surface of the planarization layer and an upper surface of the pixel electrode is smaller than a thickness of the pixel electrode, and
wherein the upper surface of the planarization layer is a surface of a portion of the planarization layer at the side of the planarization layer facing away the first substrate, the portion of the planarization layer being a portion other than the stepped hole, and the upper surface of the pixel electrode is a surface of a portion of the pixel electrode at a side of the pixel electrode facing away the first substrate, the portion of the pixel electrode being on a step of the stepped hole farthest away from the first substrate.

3. The array substrate of claim 2, wherein the upper surface of the pixel electrode is flush with the upper surface of the planarization layer.

4. The array substrate of claim 2, wherein the upper surface of the pixel electrode protrudes out of the upper surface of the planarization layer by a height smaller than the thickness of the pixel electrode.

5. The array substrate of claim 2, wherein the upper surface of the pixel electrode recesses into the upper surface of the planarization layer by a depth smaller than the thickness of the pixel electrode.

6. The array substrate of claim 1, wherein a hole of the stepped hole farthest away from the first substrate has a shape and size that is in consistent with a shape and size of the pixel electrode of the array substrate.

7. The array substrate of claim 1, wherein the array substrate is a bottom-gate type array substrate or a top-gate type array substrate.

8. The array substrate of claim 1, wherein the stepped hole comprises a first portion and a second portion, the first portion being at a side of the second portion facing the first substrate,
wherein the first portion has a diameter decreasing along the direction from the side of the planarization layer facing away the first substrate towards the side of the planarization layer facing the first substrate, and
wherein the second portion has a constant diameter along the direction from the side of the planarization layer facing away the first substrate towards the side of the planarization layer facing the first substrate.

9. A method of manufacturing an array substrate, comprising steps of:
forming a first substrate having a drain electrode protruding from a side of the first substrate;
forming a planarization layer covering the side of the first substrate where the drain electrode protrudes;
providing a stepped hole at a portion of the planarization layer on the drain electrode, a diameter of the stepped hole decreasing along a direction from a side of the planarization layer facing away the first substrate towards a side of the planarization layer facing the first substrate;
forming a pixel electrode, the pixel electrode being formed at the stepped hole and connected with the drain electrode;
forming a passivation layer covering the planarization layer and the pixel electrode; and
forming a common electrode on the passivation layer,
wherein the pixel electrode and the stepped hole are formed such that an orthographic projection of the pixel electrode on the first substrate substantially completely overlaps with an orthographic projection of the stepped hole on the first substrate.

10. The method of claim 9, wherein the step of providing the stepped hole at the portion of the planarization layer on the drain electrode comprises a step of:
providing the stepped hole at the portion of the planarization layer on the drain electrode by exposure and etching with a mask,
wherein the mask comprises a fully transparent region and a partially transparent region surrounding and directly connected with the fully transparent region, and
wherein the fully transparent region is configured to form a hole of the stepped hole closest to the first substrate, and the partially transparent region is configured to form a hole of the stepped hole other than the hole closest to the first substrate.

11. The method of claim 10, wherein an absolute value of a difference between a depth of a hole of the stepped hole farthest away from the first substrate, which is formed through the partially transparent region, and a thickness of the pixel electrode of the array substrate is smaller than the thickness of the pixel electrode.

12. The method of claim 11, wherein the depth of the hole of the stepped hole farthest away from the first substrate, which is formed through the partially transparent region, is equal to the thickness of the pixel electrode of the array substrate.

13. The method of claim 11, wherein the depth of the hole of the stepped hole farthest away from the first substrate, which is formed through the partially transparent region, is smaller than the thickness of the pixel electrode of the array substrate.

14. The method of claim 11, wherein the depth of the hole of the stepped hole farthest away from the first substrate, which is formed through the partially transparent region, is larger than the thickness of the pixel electrode of the array substrate but smaller than approximately twice of the thickness of the pixel electrode.

15. The method of claim 9, wherein the partially transparent region and the fully transparent region as an entirety have a shape and size matching with a shape and size of the pixel electrode of the array substrate, such that a hole of the stepped hole farthest away from the first substrate has a shape and size that is in consistent with the shape and size of the pixel electrode of the array substrate.

16. The method of claim 9, wherein the stepped hole is formed to comprise a first portion and a second portion, the first portion being at a side of the second portion facing the first substrate,
wherein the first portion is formed to have a diameter decreasing along the direction from the side of the planarization layer facing away the first substrate towards the side of the planarization layer facing the first substrate, and
wherein the second portion is formed to have a constant diameter along the direction from the side of the planarization layer facing away the first substrate towards the side of the planarization layer facing the first substrate.

17. An array substrate, comprising:
a first substrate having a drain electrode protruding from a side of the first substrate;
a planarization layer at the side of the first substrate where the drain electrode protrudes, the planarization layer being provided with a stepped hole on the drain electrode, and a diameter of the stepped hole decreasing along a direction from a side of the planarization layer facing away the first substrate towards a side of the planarization layer facing the first substrate;
a pixel electrode at the stepped hole and connected with the drain electrode;
a passivation layer covering the planarization layer and the pixel electrode; and
a common electrode on the passivation layer,
wherein an absolute value of a difference in height between an upper surface of the planarization layer and an upper surface of the pixel electrode is smaller than a thickness of the pixel electrode, and
wherein the upper surface of the planarization layer is a surface of a portion of the planarization layer at the side of the planarization layer facing away the first substrate, the portion of the planarization layer being a portion other than the stepped hole, and the upper surface of the pixel electrode is a surface of a portion of the pixel electrode at a side of the pixel electrode facing away the first substrate, the portion of the pixel electrode being on a step of the stepped hole farthest away from the first substrate.

18. The array substrate of claim 17, wherein the upper surface of the pixel electrode is flush with the upper surface of the planarization layer.

19. The array substrate of claim 17, wherein the upper surface of the pixel electrode protrudes out of the upper surface of the planarization layer by a height smaller than the thickness of the pixel electrode.

20. The array substrate of claim 17, wherein the upper surface of the pixel electrode recesses into the upper surface of the planarization layer by a depth smaller than the thickness of the pixel electrode.

\* \* \* \* \*